United States Patent
Park et al.

(10) Patent No.: US 6,569,737 B2
(45) Date of Patent: May 27, 2003

(54) METHOD OF FABRICATING A TRANSISTOR IN A SEMICONDUCTOR DEVICE

(75) Inventors: Seong-Hyung Park, Chungcheongbuk-do (KR); Myoung-Jun Jang, Chungcheongbuk-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/818,759

(22) Filed: Mar. 28, 2001

(65) Prior Publication Data

US 2001/0025982 A1 Oct. 4, 2001

(30) Foreign Application Priority Data

Mar. 28, 2000 (KR) ........................................ 2000-15811

(51) Int. Cl.[7] ............................................. H01L 21/336
(52) U.S. Cl. ........................ 438/270; 438/248; 438/259; 438/270; 438/391; 438/427; 438/151; 438/589; 438/318; 438/294; 257/327
(58) Field of Search .................. 257/327; 438/242, 438/248, 259, 270, 391, 427, 142, 151, 182, 271, 289, 359, 318, 309, 324, 337, 361, 329, 268, 272, 294, 296, 334, 424, 430, 689, 959

(56) References Cited

U.S. PATENT DOCUMENTS

| | | | | | |
|---|---|---|---|---|---|
| 5,413,966 | A | * | 5/1995 | Schoenborn | 438/225 |
| 5,492,858 | A | * | 2/1996 | Bose et al. | 438/67 |
| 5,763,310 | A | * | 6/1998 | Gardner | 438/270 |
| 5,776,817 | A | * | 7/1998 | Liang | 438/427 |
| 5,814,547 | A | * | 9/1998 | Chang | 438/329 |
| 6,033,959 | A | * | 3/2000 | Fu | 438/289 |
| 6,037,629 | A | * | 3/2000 | Gardner et al. | 257/333 |
| 6,277,707 | B1 | * | 8/2001 | Lee et al. | 438/270 |

* cited by examiner

*Primary Examiner*—David Nelms
*Assistant Examiner*—Andy Huynh
(74) *Attorney, Agent, or Firm*—Birch, Stewart, Kolasch & Birch, LLP

(57) ABSTRACT

Forming a semiconductor transistor by embedding the gate electrode into the substrate so that a step difference between the gate electrode and the source or drain region is reduced. Device isolation areas are defined by forming at least two first trenches having a first depth. The gate electrode is formed in a second trench located between the first trenches at a second depth being less than the first depth. A source and a drain are respectively formed between the gate electrode and the device isolation areas. The gate electrically connects the source and drain to form a semiconductor channel in the substrate.

23 Claims, 3 Drawing Sheets

METHOD OF FABRICATING A TRANSISTOR IN A SEMICONDUCTOR DEVICE

BACKGROUND OF THE INVENTION

1. Field of Invention

Figure 1A:
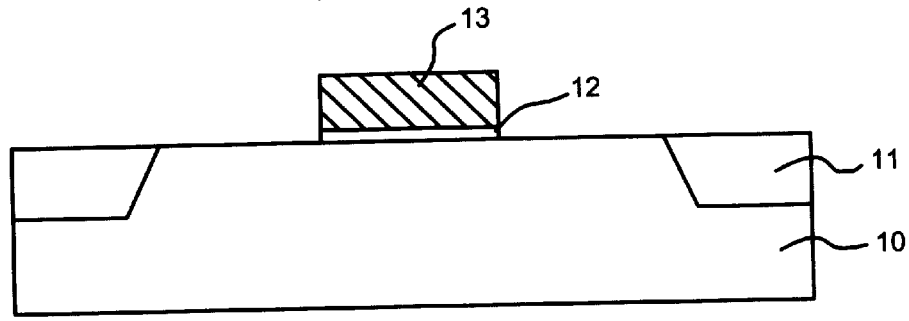

The present invention relates to a method of fabricating a transistor in a semiconductor device, more particularly, to a method of fabricating a MOS transistor in a semiconductor device which reduces a fabricating cost, reducing the step difference between a surface of a source/drain and a gate, and improves a short channel effect, not by forming an additional epitaxial layer, but by forming trenches of which depths are different one another for defining both a gate area and a device isolation area and then by forming a device isolation layer and a gate successively.

2. Discussion of Related Art

As the size of semiconductor devices decrease, device density and performance can be greatly improved as more devices can be formed within a given area or footprint. On the contrary, the characteristics of a device may be degraded due to microscopic effects such as a short channel effect, a narrow channel effect and the like, caused by semiconductor devices being highly integrated and packed more closely together.

Short channel effect refers to when the channel length of a MOS transistor becomes shorter, and charges in a channel region are strongly affected by not only the gate voltage, but also by other charges such as, electrical fields and potential distributions of a depletion layer in the source/drain regions.

In a MOS transistor having a short channel, the voltage level in a channel region varies greatly since the drain voltage influences the channel and source regions, thereby reducing the threshold voltage and the voltage between a source and a drain to thus degrade the subthreshold voltage characteristics.

The decrease of the threshold voltage also depends on an impurity-doped density of the substrate, the depth of an impurity diffusion region of the source/drain, and the thickness of a gate oxide layer, as well as the drain voltage. In general, as the drain voltage increases, the substrate bias is made deeper, the gate oxide layer thickness increases, the substrate impurity concentration is decreased, or as the depths of the source/drain are made deeper, the threshold voltage decrease due to the short channel effect is magnified.

The subthreshold voltage characteristics refer to the relation between the drain current and the gate voltage in an inversion state produced when a predetermined voltage equal to or lower than the threshold voltage is applied to the gate electrode. Such characteristics play a great role in determining the performance of a MOS transistor as a switching device. Particularly in a MOS memory requiring charge storage, critical malfunctions of the device are caused by charge loss due to leakage current if the subthreshold voltage characteristics are poor.

Moreover, the voltage between the source and drain, which determines the limit of the source voltage by which a MOS transistor having a short channel can operate, depends greatly on the channel length. This voltage is decided by a punch-through effect of the short channel. A punch-through effect refers to the state in which the depletion layers of the source and drain are connected together, and is affected by the characteristics of the substrate surface or the internal conditions of the substrate.

In the related art, such short channel effect is improved by defining a device isolation area and a device active area with a trench type field oxide layer, then forming a gate oxide layer and a gate on the silicon substrate, and then selectively growing a mono-crystalline layer in a epitaxial manner on exposed regions of the active layer of the substrate so that the regions where the source and drain are to be formed protrude above the substrate surface.

Figure 1B:
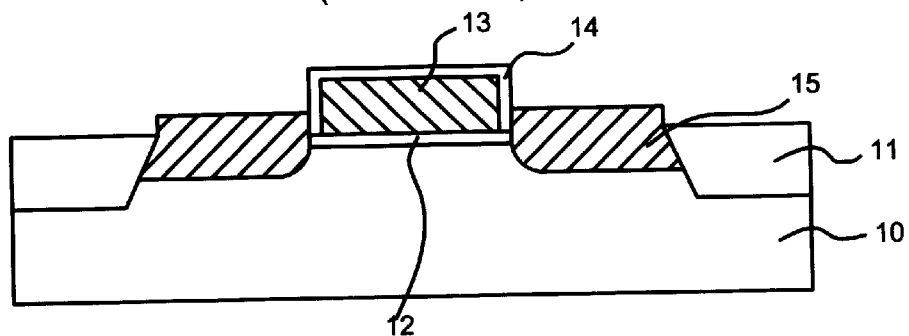
Figure 1C:
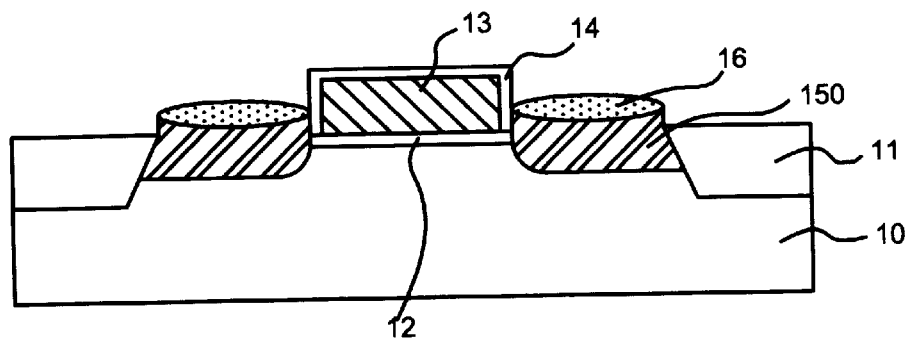

FIG. 1A to FIG. 1C show cross-sectional views of fabricating a MOS transistor in a semiconductor device according to the related art.

Referring to FIG. 1A, a device isolation area and an active area are defined in a silicon substrate 10 of a first conductive type semiconductor by forming a device isolating layer, i.e., a field oxide layer 11 using shallow trench isolation (STI). Particularly after a trench has been formed by selectively etching a predetermined portion of the substrate, a field oxide layer 11 is formed by filling the trench with an insulator such as silicon oxide or the like. Alternatively, the oxide layer 11 may be formed by selectively oxidizing a predetermined portion of the silicon substrate 10 by local oxidation of silicon (LOGOS). An oxide layer used for a gate insulating layer 12 is formed by thermally oxidizing an exposed surface of the substrate 10. Next, a doped polysilicon layer, used for an electrode, is formed on the oxide layer by chemical vapor deposition (hereinafter CVD). After the doped polysilicon layer has been coated with a photoresist, a photoresist pattern is formed by exposure and development using an exposure mask defining a gate electrode forming region. Successively, a gate electrode 13 and a gate insulating layer 12 are formed by selectively removing portions of the polysilicon layer and the oxide layer which are not covered with the photoresist pattern using an anisotropic etch method. Then, the photoresist pattern is removed by $O_2$ ashing or the like.

Referring to FIG. 1B, a layer 14 of oxide which insulates the gate electrode 13 is formed by oxidizing an exposed surface of the gate electrode 13. In this case, the protection layer 14 is used for electrically isolating the gate electrode 13 from the source/drain which will later be formed in an epitaxial layer. Then, a mono-crystalline layer 15 is grown on an exposed surface of the active area of the substrate 10 using an epitaxial method. Thus, the mono-crystalline layer 15 where the source/drain will be formed protrudes above the surface of the substrate 10, thereby reducing a step difference between the source/drain forming area and the gate electrode 13.

However, there is a disadvantage due to increased manufacturing costs in forming the mono-crystalline layer 15 using the epitaxial method. Referring to FIG. 1C, an ion-buried layer used for impurity diffusion regions for forming a source/drain, is formed by carrying out ion-implantation on the mono-crystalline layer 15 with second conductive type impurities using the gate electrode 13 and the protection layer 14 as an ion-implantation mask. Thereafter, a source and a drain of an impurity diffusion region 150 are formed by sufficiently diffusing the second conductive type impurity ions in the ion-buried layer by thermal treatment such as annealing or the like.

Then, as an option, a silicide layer 16 of $WSi_x$ or the like may be formed on an exposed surface of the impurity diffusion region 150 to reduce contact resistance. In this case, the silicide layer 16 may be formed by a salicidation method.

Unfortunately, the method of fabricating a transistor in a semiconductor device according to the related art is expensive and thus not cost competitive compared to other conventional device manufacturing processes, because the forming of the source/drain formation region to protrude above the substrate comprising a mono-crystalline layer employs an expensive epitaxial method.

SUMMARY OF THE INVENTION

Accordingly, the present invention is directed to a method of fabricating a transistor in a semiconductor device that substantially obviates one or more of the problems due to limitations and disadvantages of the related art.

The present invention provides a method of fabricating a MOS transistor in a semiconductor device which reduces fabricating costs, reduces the step difference between the surface of the source/drain and the gate, and improves a short channel effect by forming trenches of different depths at predetermined portions of the substrate for defining both a gate formation area and a device isolation area, and then by forming a gate and a device isolation layer gate successively thereafter. An additional epitaxial layer need not be formed, thus manufacturing costs are reduced.

Additional features and advantages of the invention will be set forth in the description which follows and in part will be apparent from the description, or may be learned by practice of the invention as understood by those skilled in the art. Other advantages of the invention will be realized and attained by the structure particularly pointed out in the written description and claims hereof as well as the appended drawings.

To achieve these and other advantages and in accordance with the present invention, as embodied and broadly described, the present invention includes the steps of forming a first trench and a second trench in a first conductivity type semiconductor substrate in which an active area and a device isolation area are defined. A gate forming area is defined in the active area, the first trench is formed to a first depth to define the device isolation area, and simultaneously, the second trench is formed to a second depth to define the gate forming area by removing predetermined portions of the substrate. A device isolation layer is formed by filling up the first trench with an insulator. Then, a gate insulating layer is formed on an inner surface of the second trench, filling up the second trench with a conductive substance wherein the second trench is covered with the gate insulating layer. Then, a pair of impurity diffusion regions of a second conductivity type are formed respectively in the active area of the substrate between the first and second trenches.

Preferably, the step of simultaneously forming a first trench and a second trench further includes the steps of forming an etch mask exposing only the device isolation area and the gate forming area of the semiconductor substrate; forming a sacrificial layer covering only the gate forming area of the exposed surfaces of the semiconductor substrate using a substance having a high etch selectivity ratio with the etch mask; implanting impurity ions into the exposed device isolation area of the semiconductor substrate to increase an etch rate of the semiconductor substrate; re-exposing the surface of the semiconductor substrate of the gate forming area by removing the sacrificial layer; and removing the exposed portions of the semiconductor substrate by predetermined depths in the device isolation area and the gate forming area.

More preferably, the method further includes the step of forming a silicide layer on the impurity diffusion regions. In another aspect, the present invention includes the steps of forming a first etch mask on a predetermined portion of a first conductivity type semiconductor substrate in which an active and a device isolation area are defined, wherein a gate forming area is defined in the active are and wherein the first etch mask is formed to expose the device isolation area; increasing an etch rate of the exposed device isolation area of the substrate by ion implantation; forming a second etch mask exposing the gate forming area of the semiconductor substrate by removing a portion of the first etch mask; simultaneously forming a first trench and a second trench removing portions of the substrate exposed by the second etch mask wherein the first and second trenches differ in depth and defines the device isolation area and the gate forming area, respectively; forming a device isolation layer by filling up the first trench with an insulator; forming a gate insulating layer on an inner surface of the second trench; forming a conductive layer on the second etch mask and device isolation layer including the second trench covered with the gate insulating layer; exposing the upper surfaces of the device isolation layer and the second etch mask by carrying out chemical/mechanical polishing on the conductive layer, wherein a gate formed of a potion of the conductive layer remaining only in the second trench; forming an additional insulating layer on an exposed surface of the gate; removing the second etch mask; and forming impurity diffusion regions of a second conductivity type respectively in the active area of the substrate between the first and second trenches.

Preferably, the step of exposing the upper surfaces of the device isolation layer and the second etch mask by carrying out chemical/mechanical polishing on the conductive layer wherein a gate formed of a portion of the conductive layer remaining only in the second trench further comprising the steps of forming a photoresist pattern covering over only the first trench on the conductive layer; leaving a portion of the conductive layer on the gate insulating layer in the second trench by removing the rest of the conductive layer not covered with the photoresist pattern; removing the photoresist pattern; and forming a gate by removing portions of the remaining conductive layer; the device isolation layer, and the gate insulating layer to expose a top surface of the second etch mask by planarization, wherein the gate is formed of the remaining conductive layer.

It is to be understood that both the foregoing general description and the following detailed description are only exemplary and explanatory, and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the invention and together with the description serve to explain the features of the invention.

In the drawings:

FIG. 1A to FIG. 1C show cross-sectional views of fabricating a MOS transistor in a semiconductor device according to the related art; and FIG. 2A to FIG. 2F show cross-sectional views of fabricating a MOS transistor in a semiconductor device according to the present invention.

DETAILED DESCRIPTION OF PREFERRED EMBODIMENTS

Reference will now be made in detail to the preferred embodiments of the present invention, examples of which are illustrated in the accompanying drawings.

The present invention reduces the step difference between a surface of a source/drain and a gate by forming a pair of trenches of a first depth to form device isolation areas and by forming a gate in a second trench of a second depth. Moreover, the present invention forms a device isolation layer forming area (which defines an active area and a device isolation area) and a gate forming area by simultaneously removing predetermined portions of the substrate so as to form trenches. In this case, the depths of the trenches for a gate electrode and for a device isolation area are different because a device isolation layer forming area of the silicon substrate is degraded by a simple ion-implantation. Namely, the trenches of different depths are formed by reducing an etch rate of the device isolation layer forming area of the substrate by ion-implantation so that an etch rate of the gate forming area is different from that of the device isolation forming area.

In the process of forming a device isolation layer, after a gate forming area has been formed by forming a trench in the substrate, a gate electrode is formed by selectively filling only the trench with a conductor such as doped polysilicon or the like.

In another process of forming trenches, after an etch mask of a silicon nitride layer exposing a device isolation layer forming area and a gate forming area of the substrate has been formed on the silicon substrate, the gate forming area is covered with photoresist or the like. Then, the exposed surface of the silicon substrate is made porous by ion-implantation, which makes an etch rate of the ion-implanted part differ from the neighboring part. In this case, various kinds of the ions which allow the lattice or crystal characteristics of the substrate to be degraded may be used for the ion-implantation.

After the surface of the gate forming area of the substrate has been exposed again, a first trench for a device isolation layer and a second trench for a gate electrode are formed simultaneously by removing portions of the silicon substrate which are not protected by the etch mask. In this case, the depth of the first trench is deeper than that of the second trench.

After a device isolation layer and a gate have been formed successively, the etch mask is removed to expose a substrate surface of a source/drain forming area.

Then, a source and a drain are formed by doping the exposed portions of the substrate of the source/drain forming area with impurities. Thus, a top surface of a source/drain in a MOS transistor fabricated by the present invention does not only protrude above the top surface of the substrate, but also reduces the step difference between the gate electrode and the source/drain.

FIG. 2A to FIG. 2F show cross-sectional views of fabricating a MOS transistor in a semiconductor device according to the present invention.

Figure 2A:
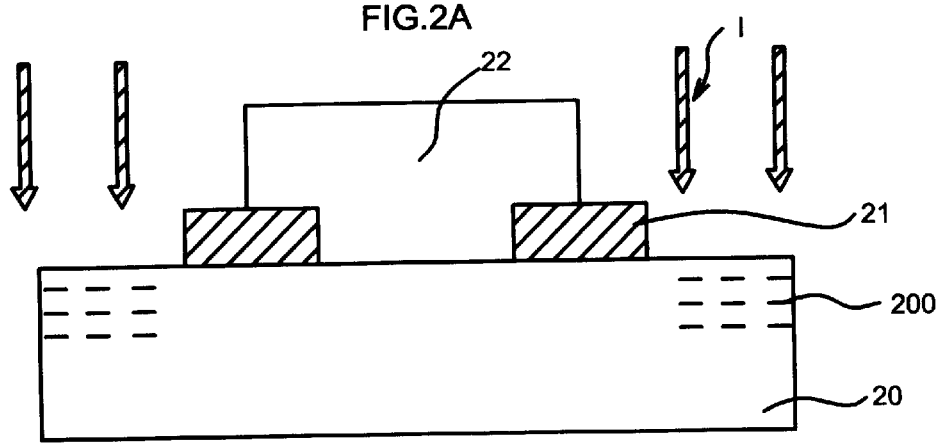

Referring to FIG. 2A, a silicon nitride layer is formed to a predetermined thickness on a silicon substrate 20 of first conductive type semiconductor by CVD. In this case, a first conductive type well may be formed in the silicon substrate 20 by ion-implantation and annealing using an ion-implantation mask for forming a well. Also, a buffer oxide layer (not shown in the drawing) minimizing the mechanical stress between the silicon substrate 20 and the silicon nitride layer may be formed on the substrate by thermal oxidation.

After the silicon nitride layer has been coated with photoresist, a first photoresist pattern (not shown in the drawing) exposing portions of the silicon nitride layer over a gate forming area and a field oxide layer forming area for device isolation is formed by exposure and development.

After an etch mask 21 exposing a portion of the silicon substrate 20 has been formed by removing a portion of the silicon nitride layer which is not protected by the first photoresist pattern by anisotropic etching such as dry etching, the first photoresist pattern is removed by $O_2$ ashing or the like. Thus, the gate forming area and the field oxide layer forming area of the silicon substrate 20 are only exposed.

After the entire surface of the substrate 20 has been coated with photoresist, a second photoresist pattern 22 covering the surface of the substrate 20 only above the gate forming area is formed by exposure and development. Thus, the active area of the silicon substrate 20 is covered with the second photoresist pattern 22 and the etch mask 21, while the device isolation area of the silicon substrate 20 is exposed.

Then, an ion-implantation I is carried out on the exposed device isolation area of the silicon substrate 20 to degrade the physical characteristics thereof.

In this case, an etch rate of the ion-implanted area is increased by the buried ions 200 which weaken the lattice structure of the substrate. In order to increase the etch rate of the device isolation area of the substrate, as explained in the above description, the etch mask 21 and the second photoresist pattern 22 are used.

In another embodiment of the present invention, after a nitride pattern exposing only a device isolation area has been formed on the substrate, ion-implantation for increasing an etch rate thereof is carried out on the exposed and ion-implanted device isolation area of the substrate. Then, a portion of the substrate of the gate forming area is exposed by removing predetermined portions of the nitride pattern by photolithography.

Next, trenches having different depths for forming a device isolation layer and a gate electrodes are formed by etching the exposed portions of the substrate using the nitride pattern as an etch mask to expose both the device isolation and the gate forming areas simultaneously.

Figure 2B:
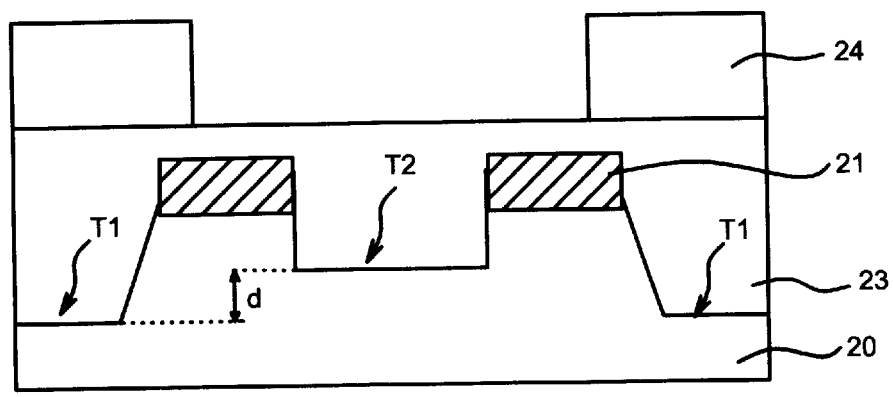

Referring to FIG. 2B, the gate forming area of the silicon substrate 20 is exposed by removing the second photoresist pattern 22 by $O_2$ ashing. Thus, the gate forming area and the device isolation layer forming area of the substrate are exposed, while the rest of the substrate 20 is covered with the etch mask 21 of the remaining silicon nitride layer.

A first trench T1 for the device isolation layer forming area and a second trench T2 for the gate forming area are formed by removing the exposed substrate 20 to the predetermined depths by carrying out anisotropic etching, such as dry etching. In this case, the first and second trenches T1, T2 are formed by removing the exposed parts of the silicon substrate 20 by reactive ion etch or plasma etch, wherein the first trench forming area which has been degraded due to the ion implantation, shows an etch rate that is faster than that of the second trench forming area.

Therefore, the depth of the first trench is deeper than that of the second trench to the depth by an amount 'd', as the first and second trench forming areas are etched by the same etch method and time, but at different rates.

An oxide layer 23, sufficiently filling the first and second trenches T1, T2 is formed over the entire substrate including the etch mask 21.

Then, after the oxide layer 23 has been coated with photoresist, a third photoresist pattern 24 exposing the oxide layer 23 over the gate forming area is formed by exposure and development. The third photoresist pattern 24 is used as an etch mask for re-exposing the gate forming area. In this case, the third photoresist pattern 24 may expose a portion of the oxide layer 23 over the etch mask 21 of the remaining nitride layer to additionally secure a process margin.

Figure 2C:
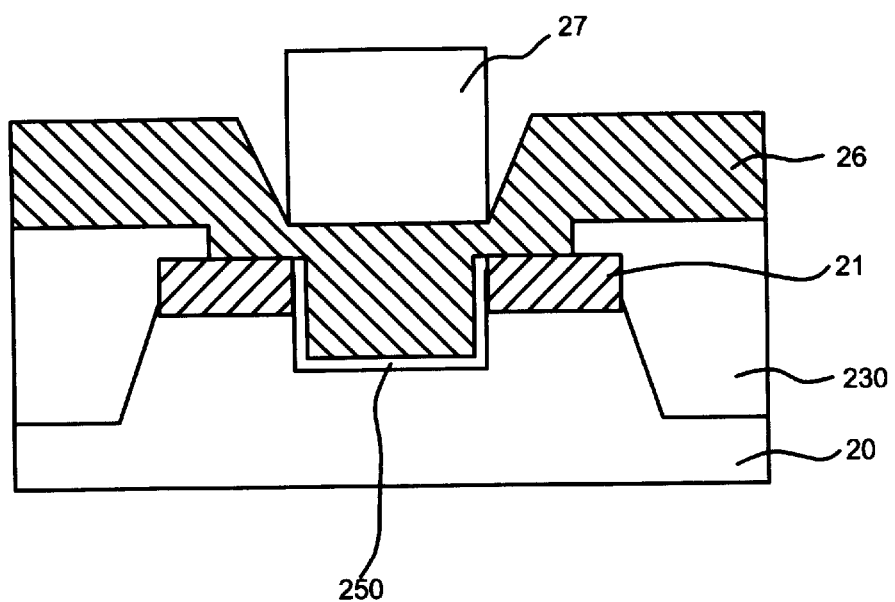

Referring to FIG. 2C, a surface of the silicon substrate 20 of the second trench T2 as the gate forming area is exposed by removing the exposed oxide layer 23 using the third photoresist pattern 26 as an etch mask. In this case, a portion of the etch mask 21 may also be exposed to secure the process margin of alignment. Then, the third photoresist pattern 24 is removed by $O_2$ ashing.

Next, a gate insulating layer 250 of silicon oxide is formed thinly on the exposed surfaces of the second trench T2. In this case, the gate insulating layer 250 is formed by growing silicon oxide on the exposed surfaces of the silicon substrate 20 by thermal oxidation.

Thus, most of the oxide layer 23 remaining in the first trench T1 becomes a field oxide layer forming a device isolation layer 230, while the surface of the second trench T2 is covered with the gate insulating layer 250.

Then, a polysilicon layer 26 doped with impurities to provide a gate electrode with electric conductivity is formed by CVD over the entire surface of the substrate 20 including the device isolation layer 230, the exposed surface of the etch mask 21 of nitride, and the gate insulating layer 250. After the polysilicon layer 26 has been coated with photoresist, a fourth photoresist pattern 27 covering only the gate forming area only is formed by exposure and development. Namely, the fourth photoresist pattern 27 is formed to cover the polysilicon layer 26 over only the second trench only.

Figure 2D:
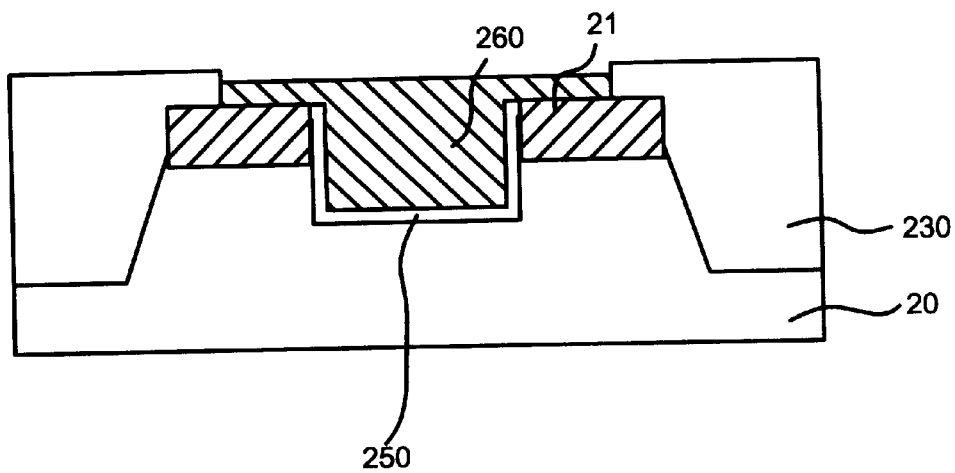

Referring to FIG. 2D, a surface of the device isolation layer 230 is exposed and a portion of the polysilicon layer 260 remains in the second trench T2 by removing the polysilicon layer which is not protected by the fourth photoresist pattern 27. In this case, the remaining polysilicon layer 260 will become a gate electrode after an etching step is further carried out using the surface of the device isolation layer 230 as an etch stopper.

Then, the fourth photoresist pattern 27 is removed by $O_2$ ashing or the like. Thus, there is a small step difference between the exposed surface of the device isolation layer 230 and the remaining polysilicon layer 260, thereby providing a nearly planarized surface over the substrate 20.

Figure 2E:
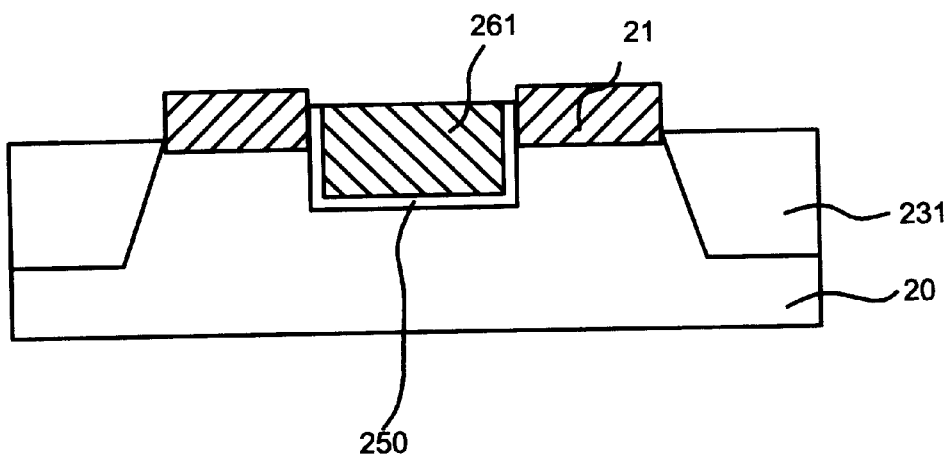

Referring to FIG. 2E, the surface of the etch mask 21 of the remaining silicon nitride is exposed by planarizing the surfaces of the exposed device isolation layer 230 of silicon oxide and the remaining polysilicon layer. In this case, the planarization is achieved by carrying out chemical/mechanical polishing (CMP) or etchback to form the exposed device isolation layer 231 and form a gate electrode 261 from the remaining polysilicon layer 260.

Therefore, a gate electrode 261 consisting of the planarized polysilicon layer is completed with the gate insulating layer 250 being inserted in the second trench T2. In this case, a portion of the etch mask 21 is etched slightly due to CMP.

A part of the silicon substrate 20 beneath the remaining etch mask 21 is a source/drain forming area as an active area, and the step difference between the gate electrode 261 and the source/drain forming area is reduced greatly.

Figure 2F:
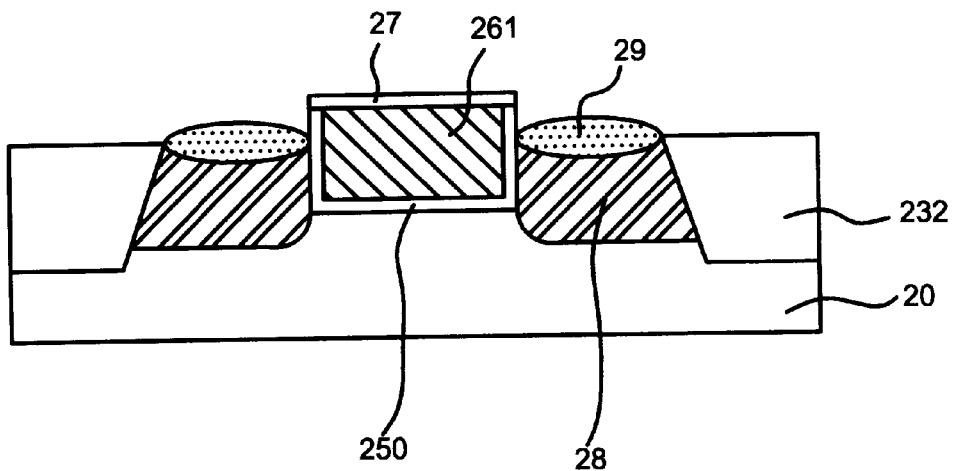

Referring to FIG. 2F, an additional insulating layer 27 is formed to isolate an exposed surface of the gate electrode 261 by oxidizing the exposed surface of the gate electrode 261.

An active area of the silicon substrate 20 is exposed by removing the remaining etch mask 21 consisting of the remaining silicon nitride by wet etch. after an ion buried layer has been formed in the source/drain forming area by carrying out ion implantation with second type impurity ions using the additional insulating layer 27 and the gate electrode 261 as an ion-implantation mask, a pair of second conductive type impurity diffusion regions 28 opposing each other centering around the gate electrode 261 are formed by diffusing the implanted ion.

Thus, a pair of the impurity diffusion regions 28 being at elevated levels become a source/drain 28 of which the step difference with the gate electrode 261 is greatly reduced. Then, as an option, a silicide layer 29 for reducing contact resistance is formed on the surfaces of the exposed impurity diffusion regions 28. Accordingly, the present invention reduces the step difference between the gate and the source/drain. Also, the present invention simplifies the fabricating process and reduces the product cost by simultaneously forming the first and second trenches having different depths thereof instead of employing an epitaxial layer process. Moreover, the present invention secures a sufficient process margin for defining a gate forming area.

It will be apparent to those skilled in the art that various modifications and variations can be made in a method of fabricating a transistor in a semiconductor device of the present invention without departing from the spirit or scope of the invention. Thus, it is intended that the present invention cover the modifications and variations of this invention provided they come within the scope of the appended claims and their equivalents.

What is claimed is:

1. A method of fabricating a transistor in a semiconductor device, comprising:

forming a first trench and a second trench in a first conductivity type semiconductor substrate in which an active area and a device isolation area are defined, wherein a gate forming area is defined in the active area, and wherein the first trench is formed to a first depth to define the device isolation area and the second trench is formed having a second depth, less than the first depth to define the gate forming area, the first and second trenches being formed simultaneously by removing predetermined portions of the substrate;

forming a device isolation layer by filling up the first trench with an insulator;

forming a gate insulating layer on an inner surface of the second trench;

filling the second trench having the gate insulating layer with a conductive substance; and forming a pair of impurity diffusion regions of a second conductivity type respectively, in the active area of the substrate between the first and second trenches, without having formed an epitaxial layer.

2. The method of fabricating a transistor in a semiconductor device, the step of forming a first trench and a second trench further comprises:

forming an etch mask exposing only the device isolation area and the gate forming area on the semiconductor substrate;

forming a sacrificial layer covering only exposed surfaces of gate forming area with a substance having a high etch selectivity ratio with the etch mask;

implanting impurity ions increasing an etch rate of the semiconductor substrate into the exposed device isolation area of the semiconductor substrate;

exposing the surface of the semiconductor substrate of the gate forming area by removing the sacrificial layer; and removing exposed portions of the semiconductor substrate in the device isolation area and the gate forming area.

3. The method of fabricating a transistor in a semiconductor device according to claim 2, wherein the sacrificial layer is formed of photoresist material.

4. The method of claim 2, wherein the etch mask is formed by forming a nitride layer on the semiconductor substrate and then by patterning the nitride layer by photolithography.

5. The method of claim 4, further comprising the step of forming a buffer layer between the nitride layer and the semiconductor substrate.

6. The method of claim 2, wherein the step of forming the device isolation layer further comprises:

forming an oxide layer on the etch mask wherein the oxide layer is formed to a thickness enabling to filling up the first and second trenches sufficiently; and exposing an inner surface of the second trench by removing the oxide layer in the second trench.

7. The method of claim 1, further comprising the step of forming a silicide layer on the impurity diffusion regions.

8. The method of claim 1, the step of forming the impurity diffusion regions further comprising:

forming an ion-buried layer in the active area of the semiconductor substrate except the first trench by ion implantation with impurity ions of the second conductive type; and diffusing the impurity ions in the ion-buried layer.

9. The method of claim 1, the step of filling up the second trench with a conductive substance further comprising the step of forming an insulating layer on an exposed surface of the conductive substance.

10. A method of fabricating a transistor in a semiconductor device, comprising:

forming a first etch mask on a predetermined portion of a first conductivity type semiconductor substrate in which an active area and a device isolation area are defined wherein a gate forming area is defined in the active area and wherein the first etch mask is formed to expose the device isolation area;

increasing an etch rate of the exposed device isolation area of the substrate by ion implantation;

forming a second etch mask exposing the gate forming area of the semiconductor substrate additionally by removing a portion of the first etch mask;

forming a first trench and a second trench simultaneously by removing portions of the substrate exposed by the second etch mask wherein the first trench has a first depth and the second trench has a second depth, less than the first depth, to define the device isolation area and the gate by;

forming a device isolation layer by filling up the first trench with an insulator;

forming a gate insulating layer on an inner surface of the second trench;

forming a conductive layer on the second etch mask and device isolation layer including the second trench covered with the gate insulating layer;

exposing tops of the device isolation layer and the second etch mask by carrying out chemical mechanical polishing on the conductive layer wherein a gate formed of a portion of the conductive layer remains only in the second trench;

forming an additional insulating layer on an exposed surface of the gate;

removing the second etch mask; and forming a pair of impurity diffusion regions of a second conductivity type respectively in the active area of the substrate between the first and second trenches without having formed an epitaxial layer.

11. The method of claim 10, wherein the etch mask is formed by forming a nitride layer on the semiconductor substrate and then by patterning the nitride layer by photolithography.

12. The method of claim 10, wherein the method further comprising the step of forming a buffer layer for releasing a stress between the nitride layer and the semiconductor substrate.

13. The method of claim 10, wherein the method further comprising the step of forming a silicide layer on the impurity diffusion regions.

14. The method of claim 10, wherein the step of forming the impurity diffusion regions further comprising:

forming an ion-buried layer in the active area of the semiconductor substrate except the first trench by ion implantation with impurity ions of the second conductivity type; and diffusing the impurity ions in the ion-buried layer.

15. The method of claim 10, wherein the step of exposing portions of the device isolation layer and the second etch mask is performed by carrying out chemical mechanical polishing on the conductive layer, wherein a gate formed of a portion of the conductive layer remaining only in the second trench further comprising:

forming a photoresist pattern only covering over the first trench on the conductive layer;

leaving a portion of the conductive layer on the gate insulating layer in the second trench by removing portions of the conductive layer not covered with the photoresist pattern;

removing the photoresist pattern; and forming a gate by removing portions of the remaining conductive layer, the device isolation layer, and the gate insulating layer to expose a portion of the second etch mask by planarization, wherein the gate is formed of the remaining conductive layer.

16. A method of forming a semiconductor transistor comprising:

forming isolation regions in a substrate at a first depth;

forming a gate electrode in the substrate between the isolation regions at a second depth at the same time said isolation regions are formed at said first depth, without having formed an epitaxial layer; and forming a source and a drain between the isolation regions and the gate electrode.

17. A method of forming a semiconductor transistor comprising:

forming a pair of first trenches in a non-active region of a substrate;

forming a second trench in an active region of the substrate at the same time said pair of first trenches are formed;

forming a source region and a drain region adjacent each first trench; and forming a gate region in the second trench, the gate region electrically connecting the source region with the drain region, without having formed an epitaxial layer.

18. A method of forming a semiconductor transistor, comprising:
- forming a first trench in a substrate;
- forming a second trench in the substrate opposing the first trench, at the same time the first trench is formed;
- forming a third trench between the first and second trenches, at the same time the first and second trenches are formed, said third trench having a depth that is less than a depth of the first and second trenches;
- forming a source between the first trench and the third trench;
- forming a drain between the second trench and the third trench; and
- forming a gate in the third trench, the gate electrically controlling a semiconductor channel formed between the source and the drain without having formed an epitaxial layer.

19. The method of claim 18, wherein the first and second trenches are formed by etching at a first rate.

20. The method of claim 19, wherein the third trench is formed by etching at a second rate.

21. The method of claim 20, wherein the first rate and the second rate are different.

22. The method of claim 21, wherein the first rate is greater than the second rate.

23. The method of claim 19, wherein the method does not require formation of a mono-crystalline layer.

* * * * *